(12) United States Patent
Diegmann

(10) Patent No.: US 10,991,341 B2
(45) Date of Patent: Apr. 27, 2021

(54) METHOD FOR PERFORMING A BUS AUTOSET FUNCTION AND MEASUREMENT DEVICE

(71) Applicant: Rohde & Schwarz GmbH & Co. KG, Munich (DE)

(72) Inventor: Philip Diegmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 314 days.

(21) Appl. No.: 15/940,731

(22) Filed: Mar. 29, 2018

(65) Prior Publication Data

US 2018/0286359 A1    Oct. 4, 2018

(30) Foreign Application Priority Data

Mar. 30, 2017  (EP) ..................................... 17163782

(51) Int. Cl.
| | | |
|---|---|---|
| *G09G 5/373* | (2006.01) | |
| *G01R 13/02* | (2006.01) | |
| *G01R 13/22* | (2006.01) | |
| *G06T 3/40* | (2006.01) | |

(52) U.S. Cl.
CPC ........... *G09G 5/373* (2013.01); *G01R 13/029* (2013.01); *G01R 13/0209* (2013.01); *G01R 13/0236* (2013.01); *G01R 13/22* (2013.01); *G06T 3/40* (2013.01); *G09G 2340/04* (2013.01)

(58) Field of Classification Search
None
See application file for complete search history.

(56) References Cited

U.S. PATENT DOCUMENTS

| | | | | |
|---|---|---|---|---|
| 4,426,644 | A | * | 1/1984 | Neumann ............... G01R 13/20 345/23 |
| 2007/0150776 | A1 | | 6/2007 | Smith et al. |
| 2010/0141657 | A1 | | 6/2010 | Gamper et al. |
| 2011/0060222 | A1 | * | 3/2011 | Thittai ................ G01S 7/52042 600/438 |
| 2015/0016269 | A1 | | 1/2015 | Ramchandran |
| 2017/0307678 | A1 | * | 10/2017 | Diegmann ......... G01R 13/0218 |
| 2018/0136268 | A1 | * | 5/2018 | Diegmann ............. G01R 27/14 |
| 2018/0276470 | A1 | * | 9/2018 | Diegmann ......... G06K 9/00671 |
| 2018/0278508 | A1 | * | 9/2018 | Diegmann .......... H04L 43/0894 |
| 2018/0337686 | A1 | * | 11/2018 | Diegmann ......... G01R 13/0236 |
| 2018/0337754 | A1 | * | 11/2018 | Diegmann ............ H04W 72/02 |

FOREIGN PATENT DOCUMENTS

EP          0506223 A2    9/1992

OTHER PUBLICATIONS

AN1636, Understanding and Minimising ADC Conversion Errors, 2003, STM microelectronics, 42 pages. (Year: 2003).*
Extended European Search Report dated Sep. 12, 2017, issued in priority European Application No. 17163782.0, filed Mar. 30, 2017, 6 pages.

* cited by examiner

*Primary Examiner* — Tung S Lau
(74) *Attorney, Agent, or Firm* — Christensen O'Connor Johnson Kindness PLLC

(57) ABSTRACT

A method for performing a Bus autoset function is described. A maximum amplitude of an analog signal is detected. The analog signal is converted into a logical signal. A frame in the logical signal is detected. A scale of an output unit is set such that the whole frame is output. Further, a measurement device is described.

16 Claims, 2 Drawing Sheets

METHOD FOR PERFORMING A BUS AUTOSET FUNCTION AND MEASUREMENT DEVICE

FIELD OF THE DISCLOSURE

Embodiments of the present disclosure generally relate to a method for performing a Bus autoset function as well as a measurement device.

BACKGROUND

In the state of the art, measurement devices are known that have an autoset/autoscale function. Currently, the autoset/autoscale function only takes the input signal into account as it is. For instance, the input signal is an analog signal wherein the curve representing the analog input signal is output in an optimized manner while using the autoset/autoscale function of the dedicated measurement device.

For instance, EP 0 506 223 A2 describes a autoscale topogoloy for oscilloscopes that determines the minimum and maximum values of an input signal for autoscaling purposes.

Further, the operator of the measurement device may select a Bus decode mode that is configured to decode the analog input signal in order to provide at least one event being decoded from the analog input signal. However, the enabled autoset/autoscale function still outputs the analog input signal in an optimized manner.

SUMMARY

Accordingly, there is a need for an improved autoset/autoscale function, for example, with regard to signals being decoded.

Embodiments of the present disclosure provide a method for performing a Bus autoset function, with the following steps:

Detecting a maximum amplitude of an analog signal,
Converting the analog signal into a logical signal,
Detecting a frame in the logical signal, and
Setting a scale of an output unit such that the whole frame is output.

Further, embodiments of the present disclosure provide a measurement device comprising a processing unit that is configured to perform a method as mentioned above.

Accordingly, a context-sensitive autoset/autoscale function is provided such that the information being of interest is output in an optimized manner. Usually, an event decoded from the analog input signal is of interest for the operator of the measurement device. For instance, the event is established by a frame containing certain information. The output of this event is ensured by the converting and detecting steps. Hence, a whole frame can be output comprising the information being of interest. Accordingly, the measurement device is set up in an optimized manner easily, for example the scaling, wherein the setting is done automatically without any manual input. The Bus autoset function is directed to at least one event being of interest within the analog input signal, for instance a frame within the analog input signal. Thus, a frame being decoded from the analog input signal is output. The decoded frame is detected and the scale is set such that the whole frame being decoded and detected is output in an optimized manner. Accordingly, no manual input is required to set the scaling in an appropriate manner for outputting the frame in a desired manner. This setting/adjustment is done automatically by the measurement device. The logic conversion can be done by aid of a clock signal. For instance, the data transmitted correspond to a first line whereas a second line is allocated to the clock signal used for the logic conversion. Furthermore, the Bus autoset function can be applied in real time such that the decoded event, namely the frame, is output in real time in an optimized manner. The output unit used may be part of the measurement device. Alternatively, the output unit can be established by a separate device being connected.

According to an aspect, the whole content of a frame is displayed on a display of the measurement device. This ensures that the information being of interest is displayed completely and in an optimized manner with regard to the size of the display. No additional manual input or setting is required to obtain this setup for the display. The frame may be a data frame such that the content of the data transmitted via the data frame are output. The output unit is established by the display.

According to another aspect, a trigger level is set. This trigger level can be set manually or automatically depending on the analog signal being input to the measurement device. The trigger level simplifies the conversion step as the trigger level may represent a limit. For instance, the trigger level ensures that only those portions of the analog signal are taken into account that reach or exceed the trigger level.

In some embodiments, the trigger level is set prior to the logic conversion. The converting and detecting steps are triggered as soon as a predetermined level is reached or has been exceeded.

Another aspect provides that an actuation of the autoset function is detected at the beginning. Accordingly, the method for performing a Bus autoset function is inter alia initiated once the autoset function has been actuated. Thus, a first condition is fulfilled for starting the Bus autoset function once the autoset function is actuated or initiated.

In some embodiments, the autoset function is initiated by the user initially. Thus, the user/operator manually starts the autoset function prior to the execution of the Bus autoset function. For instance, the user actuates a certain actuating element relating to the autoset function. The actuating element may be part of a touch-sensitive display of the measurement device. On this touch-sensitive display, a graphical user interface may be provided comprising several buttons, for example a button related to the autoset function.

For instance, the autoset function is initiated by actuating a corresponding button of the measurement device. Hence, the user actuates a certain button in a mechanical manner wherein this button is allocated to the autoset function. The button may be a push button or any other suitable knob. Further, the button may be part of a graphical user interface displayed on the output unit, for example the display.

Moreover, a measurement device mode set may be detected at the beginning. Thus, the measurement device also verifies if a certain measurement device mode has been set at the beginning before starting the Bus autoset function. In some embodiments, the measurement device mode selected has to be a certain Bus decode mode, for instance a I2C Bus decode mode.

Accordingly, a Bus decode mode may be initiated by the user initially. For performing the Bus autoset function, the user has to manually initiate the Bus decode mode such that the analog signal being input to the measurement device will be decoded by the measurement device in order to derive and decode an event within the analog signal, for example a frame within the analog input signal.

In a similar manner, the Bus decode mode may be initiated by actuating a certain actuating element relating to the Bus decode mode. The actuating element may be part of a touch-sensitive display of the measurement device, for instance a button. Alternatively, the actuating element is a mechanical one to be actuated by the user in a mechanical manner.

For instance, the Bus decode mode is initiated by actuating a corresponding button of the measurement device. Hence, the operator of the measurement device actuates a certain button on the measurement device in a mechanical manner in order to initiate the Bus decode mode. The button may be a push button or any other suitable knob that can be rotated for selecting a certain Bus decode mode. Alternatively, the button is provided by a graphical user interface displayed on the output unit, for example the display.

In some embodiments, it is verified at the beginning if the autoset function is enabled and the measurement device mode is set to a Bus decode mode. For starting the Bus autoset function, certain settings done by the user are verified initially by the measurement device. According to these settings to be present, the input signal shall be decoded (enabled Bus decode mode) and an autoset function, namely an automatically scaling, shall be applied (enabled autoset function). The Bus autoset function is initiated by actuating both functions, namely the autoset function and the activated Bus decode mode. Since the Bus autoset function is a context-sensitive autoset function, the content decoded from the analog input signal is output in an optimized manner with regard to the scaling.

Further, the analog signal may be decoded. The analog input signal is decoded in order to obtain the at least one frame being encompassed within the analog input signal wherein the frame represents a decoded event being of interest for the user/operator of the measurement device.

For instance, the measurement device comprises a display that is configured to display an output of the processing unit. The output of the processing unit may be the decoded event that is output in an optimized manner, for example displayed in an optimized manner. The display may display different contents simultaneously, for instance the analog signal, the decoded frames and/or the logically converted signal for information purposes wherein different display areas are provided. However, the Bus autoset function applied ensures that the different display areas are scaled with respect to the decoded frames.

According to a certain embodiment, the measurement device is an oscilloscope.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
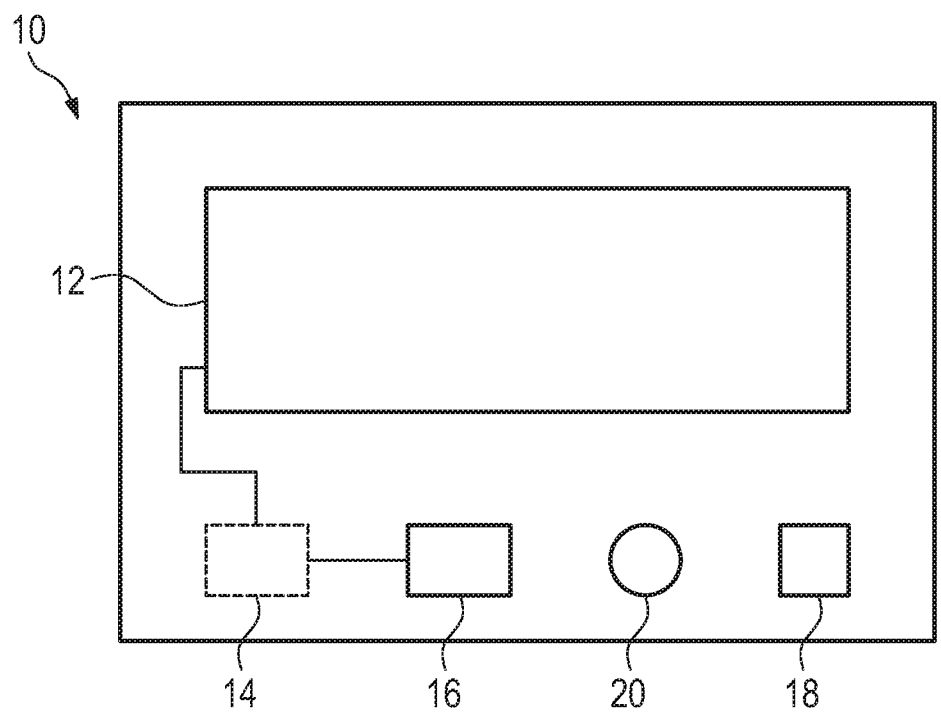
FIG. 1 schematically shows a measurement device according to an embodiment of the present disclosure.

In FIG. 1, a measurement device 10 is shown that is formed by an oscilloscope in the shown embodiment. The measurement device 10 has a display 12 that is configured to display data being received by a processing unit 14. Accordingly, the display 12 represents an output unit. The processing unit 14 is connected with at least one input 16 being configured to receive an analog signal fed to the measurement device 10 for analyzing purposes.

In addition, the measurement device 10 comprises a first actuating element 18 relating to an autoset function and a second actuating element 20 used for setting a certain measurement device mode, for example a certain Bus decode mode. In the shown embodiment, the first actuating element 18 is established by a push button that can be activated by the user/operator of the measurement device 10 in a mechanical manner. The second actuating element 20 is established by a knob being configured to be rotated in order to select a certain measurement device mode to be activated. Alternatively, both actuating elements 18, 20 may be provided by push buttons, knobs, buttons or any other suitable elements to be actuated by the user.

Figure 3:
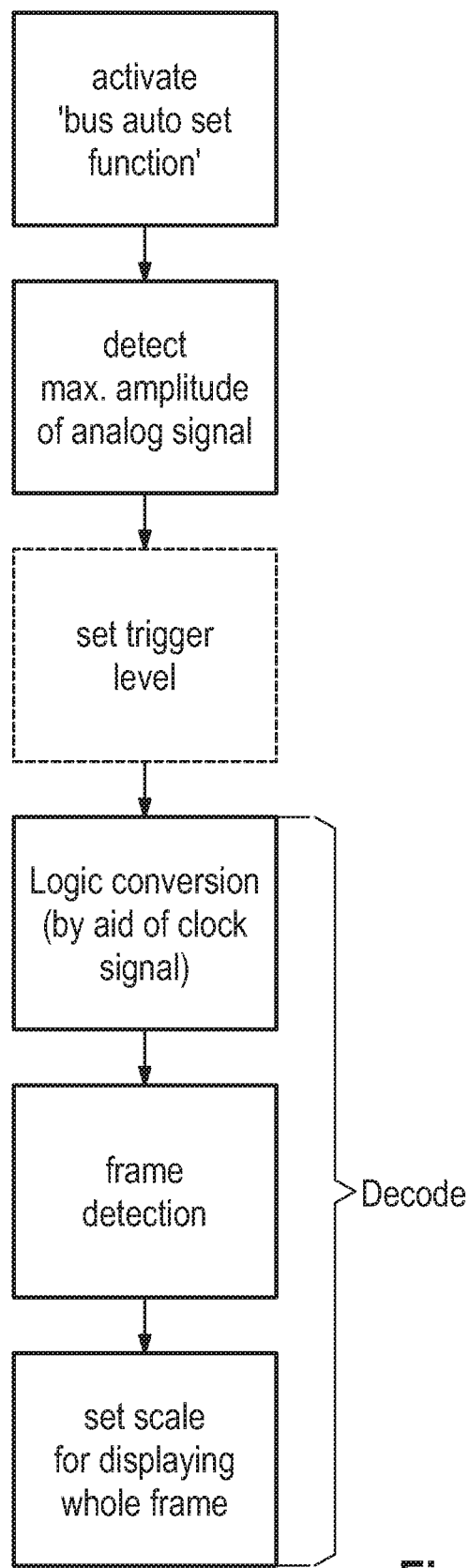

The settings done by the user/operator of the measurement device 10 with regard to the actuating elements 18, 20 influence the processing unit 14, for example the operations done by the processing unit 14. In general, the processing unit 14 is configured to perform a method for performing a Bus autoset function as will be described with respect to FIG. 3.

At the beginning, the processing unit 14 verifies if a Bus autoset function is activated. This activation may be done by the user manually by actuating the autoset function and a certain Bus decode mode, for instance an I2C Bus decode mode. Accordingly, the Bus autoset function is activated by actuating both actuating elements 18, 20 such that the autoset function is enabled and the second actuating element 20 is set such that a certain Bus decode mode is initiated. In some embodiments, the second actuating element 20 being a knob is rotated for selecting the appropriate Bus decode mode. Alternatively, the user/operator may actuate two different buttons on the measurement device 10 wherein both buttons are allocated to the autoset function and the Bus decode mode. These buttons may be part of a graphical user interface displayed on the display 12.

Then, the analog signal being fed to the input 16 is analyzed by the measurement device 10, for example the processing unit 14, as the Bus decode mode is activated wherein a maximum amplitude of the analog input signal is detected. Afterwards, an optional step may be performed according to which a trigger level is set and applied to the analog input signal in order to simplify the further processing as only those portions of the analog input signal are taken into account that reach or exceed the trigger level set. Then, the analog input signal is converted into a logical signal, for example the portions reaching or exceeding the trigger level. This logic conversion is done by aid of a clock signal, for instance. Afterwards, a detecting step is performed on the logical signal such that frames within the converted analog input signal are detected automatically.

Accordingly, the steps of converting the analog input signal and detecting frames within the analog input signal relate to a decoding of the analog input signal since events being encompassed in the analog input signal are decoded, namely the frames.

Afterwards, the scale of the measurement device 10 is set automatically such that a frame being detected is displayed in an optimized manner, for example the whole frame. Thus, the setting of the measurement device 10 with regard to the scaling is automatically done such that it is ensured that the whole frame, for example the information/content of the frame, is displayed on the display 12 of the measurement device 10 in an optimized manner.

Accordingly, the decoded frame of the analog input signal is used as the parameter for performing the autoset/autoscale function ensuring that the frame being decoded is displayed in an optimized manner. Thus, the user/operator does not have to set the scaling manually. The Bus autoset function provides a context-sensitive autoset function as the context of the analog input signal is output in an optimized manner with regard to the scaling.

Figure 2:
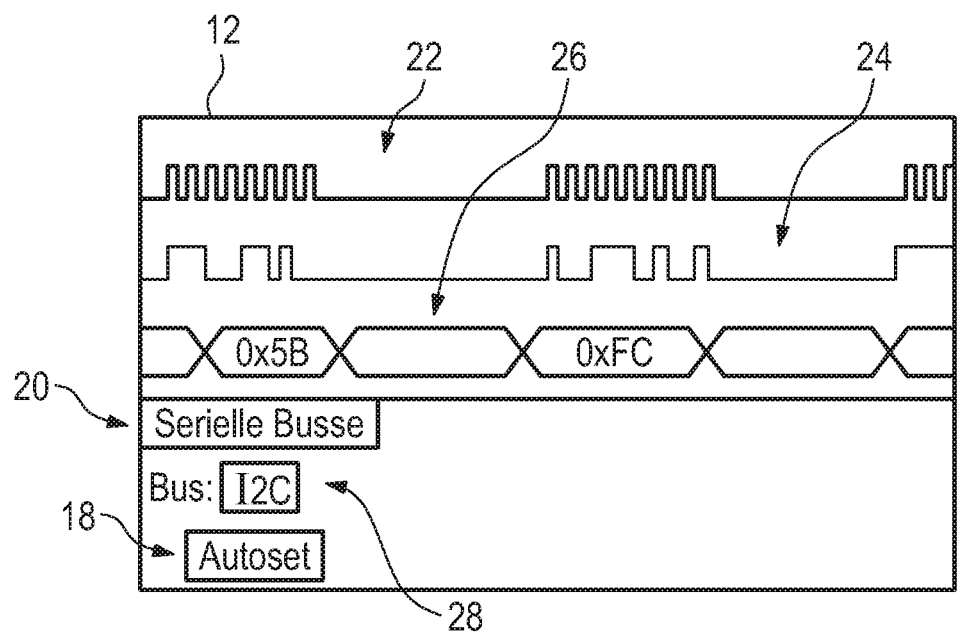
FIG. 2 shows a display of a measurement device according to an embodiment of the present disclosure, and FIG. 3 schematically shows a flow-chart of the method for performing a Bus autoset function according to an embodiment of the present disclosure.

In FIG. 2, a display 12 of a measurement device 10 according to another embodiment is shown wherein the display 12 is a touch-sensitive one. The display 12 comprises different displaying areas 22 to 28 wherein the first display area 22 is used for displaying the analog input signal being fed to the input 16 of the measurement device 10. The second display area 24 is configured to display the logical signal being provided by the processing unit 14 during the autoset function. The third display area 26 is configured to display the frame being detected/decoded from the analog input signal.

The fourth display area 28 is a setting display area as several buttons are display in a graphical user interface 30. These buttons correspond to the actuating elements 18, 20 shown in FIG. 1. As the display 12 is a touch-sensitive display, the user/operator may touch the display 12, for example the fourth display area 28, in order to actuate the actuating elements 18, 20, thus activating the autoset function and setting the Bus decode mode.

In FIG. 2, the I2C Bus decode mode is activated and the autoset function is enabled. Accordingly, the data displayed in the display areas 22 to 26 are autoset/autoscaled with regard to the frame being decoded from the analog input signal fed to the input 16.

Generally, it is ensured that the decoded information of the analog input signal is displayed on the display 12 of the measurement device 10 in an optimized manner. Therefore, the Bus autoset function provides a context-sensitive autoset ensuring to display the decoded information in an optimized manner.

It will be appreciated that the processing unit or other components described herein may include, in some embodiments, logic for implementing the technologies and methodologies described herein. This logic can be carried out in either hardware or software, or a combination of hardware and software. In some embodiments, the processing unit and/or other components may include one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof. In an embodiment, the processing unit and/or other components includes a microprocessor and a memory storing logic modules and/or instructions. In an embodiment, the processing unit and/or other components includes one or more ASICs having a plurality of predefined logic components. In an embodiment, the processing unit and/or other components includes one or more FPGA having a plurality of programmable logic components. In an embodiment, the processing unit and/or other components includes hardware circuit implementations (e.g., implementations in analog circuitry, implementations in digital circuitry, and the like, and combinations thereof). In an embodiment, the processing unit and/or other components includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for performing a Bus autoset function, the method carried out by an oscilloscope, the method comprising:
    detecting a maximum amplitude of an analog signal via a processing unit of the oscilloscope, the analog signal comprising several portions with a respective level;
    converting the analog signal into a logical signal via the processing unit;
    detecting a frame in the logical signal, the frame decoded from the analog input signal and comprising the information of interest; and
    setting a scale of an output unit via the processing unit, the scale being set automatically without any manual input such that the entire content of the frame is output, thereby providing a context-sensitive autoscale function.

2. The method according to claim 1, wherein the entire content of the frame is displayed on a display of the oscilloscope.

3. The method according to claim 1, wherein a trigger level is set.

4. The method according to claim 1, wherein an actuation of the autoset function is detected prior to said detecting a maximum amplitude of an analog signal.

5. The method according to claim 1, wherein an autoset function is initiated initially by the user.

6. The method according to claim 1, wherein an oscilloscope mode set is detected at the beginning.

7. The method according to claim 1, wherein a Bus decode mode is initiated initially by the user.

8. The method according to claim 1, wherein it is verified at the beginning if the autoset function is enabled and the oscilloscope mode is set to a Bus decode mode.

9. The method according to claim 1, wherein the analog signal is decoded.

10. The method according to claim 1, wherein the output unit includes a display, and wherein the method further comprises displaying the entire contents of the frame on the display.

11. The method according to claim 3, wherein the trigger level is set prior to the logic conversion.

12. The method according to claim 5, wherein the autoset function is initiated by actuating a corresponding button of the oscilloscope.

13. The method according to claim 7, wherein the Bus decode mode is initiated by actuating a corresponding button of the oscilloscope.

14. An oscilloscope comprising:

a processing unit configured to:

detect a maximum amplitude of an analog signal, the analog signal comprising several portions with a respective level;

convert the analog signal into a logical signal;

detect a frame in the logical signal, the frame decoded from the analog input signal and comprising the information of interest; and set a scale of an output unit automatically without any manual input such that the entire contents of the frame is output, thereby providing a context-sensitive autoscale function.

15. The device oscilloscope according to claim 14, further comprising a display that is configured to display an output of the processing unit.

16. The measurement device according to claim 14, wherein the output unit includes a display, and wherein the entire contents of the frame are displayed on the display.

* * * * *